United States Patent
Chen

(10) Patent No.: US 10,445,011 B2
(45) Date of Patent: Oct. 15, 2019

(54) FLASH MEMORY STORAGE APPARATUS

(71) Applicant: Winbond Electronics Corp., Taichung (TW)

(72) Inventor: Chung-Zen Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 21 days.

(21) Appl. No.: 15/871,124

(22) Filed: Jan. 15, 2018

(65) Prior Publication Data
US 2018/0335970 A1 Nov. 22, 2018

(30) Foreign Application Priority Data

May 19, 2017 (CN) .......................... 2017 1 0355845

(51) Int. Cl.
*G06F 3/06* (2006.01)
*G11C 5/14* (2006.01)
*G11C 16/08* (2006.01)
*G11C 16/30* (2006.01)

(52) U.S. Cl.
CPC .......... *G06F 3/0634* (2013.01); *G06F 3/0604* (2013.01); *G06F 3/0625* (2013.01); *G06F 3/0659* (2013.01); *G06F 3/0679* (2013.01); *G11C 5/145* (2013.01); *G11C 5/148* (2013.01); *G11C 16/08* (2013.01); *G11C 16/30* (2013.01)

(58) Field of Classification Search
CPC ......... G11C 16/30; G11C 5/148; G11C 16/08; G11C 5/145; G06F 3/0604; G06F 3/0625; G06F 3/0634; G06F 3/0659; G06F 3/0679

USPC .......................................................... 711/103
See application file for complete search history.

(56) References Cited

U.S. PATENT DOCUMENTS

| 6,754,111 | B2 | 6/2004 | Pekny | |
|---|---|---|---|---|
| 9,449,655 | B1 | 9/2016 | Zonte et al. | |
| 2005/0276110 | A1* | 12/2005 | Sakurai | G11C 5/147 365/185.18 |
| 2007/0064512 | A1* | 3/2007 | Kim | G11C 5/145 365/218 |

(Continued)

FOREIGN PATENT DOCUMENTS

| CN | 101984492 | 3/2016 |
|---|---|---|
| TW | 1466115 | 12/2014 |

*Primary Examiner* — Hashem Farrokh
(74) *Attorney, Agent, or Firm* — JCIPRNET

(57) ABSTRACT

A flash memory storage apparatus having a plurality of operation modes is provided. The flash memory storage apparatus includes a memory controller circuit and a memory cell array. The memory controller circuit is configured to control the flash memory storage apparatus to operate in one of the operation modes. The operation modes include a low standby current mode. The memory cell array is coupled to the memory controller circuit. The memory cell array is configured to store data. The data includes read-only memory data. The memory controller circuit controls the flash memory storage apparatus to enter the low standby current mode according to a first command. The memory controller circuit wakes up the flash memory storage apparatus from the low standby current mode according to a second command. When the flash memory storage apparatus operates in the low standby current mode, the read-only memory data is kept.

10 Claims, 2 Drawing Sheets

(56) References Cited

U.S. PATENT DOCUMENTS

| | | | | |
|---|---|---|---|---|
| 2014/0045464 A1* | 2/2014 | Adrangi | ................ | H04W 12/12 |
| | | | | 455/411 |
| 2014/0181558 A1* | 6/2014 | Taha | .................... | G06F 1/3206 |
| | | | | 713/323 |
| 2017/0236561 A1* | 8/2017 | Pedersen | ................ | G11C 5/147 |
| | | | | 365/227 |

* cited by examiner

FLASH MEMORY STORAGE APPARATUS

CROSS-REFERENCE TO RELATED APPLICATION

This application claims the priority benefit of China application serial no. 201710355845.6, filed on May 19, 2017. The entirety of the above-mentioned patent application is hereby incorporated by reference herein and made a part of this specification.

BACKGROUND OF THE INVENTION

Field of the Invention

The invention relates to a memory storage apparatus and particularly relates to a flash memory storage apparatus.

Description of Related Art

As electronic technology evolves, electronic apparatuses have become necessary tools in people's lives. In order to serve the function of large, long-term data storage, non-volatile memory has become an important medium for storing data. Among current electronic products, flash memory is one of the more popular non-volatile memories. The operation modes of the flash memory storage apparatus mainly include an active mode, a normal standby mode, and a deep power down mode.

To enter the deep power down mode, the prior art flash memory storage apparatus needs to receive a command. In the deep power down mode, all the dynamic operations of the flash memory storage apparatus are ceased. While the advantage thereof is that the consumed current is very low, it usually takes a considerable amount of time to wake up the flash memory storage apparatus that has entered the deep power down mode. The time spent is usually used to restore the circuit setting inside the flash memory storage apparatus.

On the other hand, even though the current consumption of the flash memory storage apparatus in the normal standby mode is higher, the wake-up time is shorter. The current consumed by the flash memory storage apparatus in the normal standby mode usually occurs due to the fact that a voltage generator circuit in this mode still needs to operate to provide a high voltage to a word line decoder circuit. As a result, currently it is still impossible to effectively reduce the current consumed by the flash memory storage apparatus in the normal standby mode.

SUMMARY OF THE INVENTION

The invention provides a flash memory storage apparatus that has a small standby current and a short wake-up time when operating in a low standby current mode.

The flash memory storage apparatus of the invention has a plurality of operation modes. The flash memory storage apparatus includes a memory controller circuit and a memory cell array. The memory controller circuit is configured to control the flash memory storage apparatus to operate in one of the plurality of operation modes. The plurality of operation modes include a low standby current mode. The memory cell array is coupled to the memory controller circuit. The memory cell array is configured to store data. The data includes read-only memory data. The memory controller circuit controls the flash memory storage apparatus to enter the low standby current mode according to a first command. The memory controller circuit wakes up the flash memory storage apparatus from the low standby current mode according to a second command. When the flash memory storage apparatus operates in the low standby current mode, the read-only memory data (ROM data) is kept.

The flash memory storage apparatus of the invention has a plurality of operation modes. The flash memory storage apparatus includes a memory controller circuit and a memory cell array. The memory controller circuit is configured to control the flash memory storage apparatus to operate in one of the plurality of operation modes. The plurality of operation modes include a low standby current mode. The memory cell array is coupled to the memory controller circuit. The memory cell array is configured to store data. The data includes read-only memory data. The memory controller circuit controls the flash memory storage apparatus to enter the low standby current mode according to a first command. The memory controller circuit wakes up the flash memory storage apparatus from the low standby current mode according to a second command. The plurality of operation modes include a normal standby mode and a deep power down mode. The flash memory storage apparatus has a first current, a second current, and a third current when operating in the low standby current mode, the normal standby mode, and the deep power down mode respectively. The first current is smaller than the second current and greater than the third current.

Based on the above, in the exemplary embodiments of the invention, the flash memory storage apparatus enters or leaves the low standby current mode according to the command. And when the flash memory storage apparatus operates in the low standby current mode, the read-only memory data is kept. Consequently, the flash memory storage apparatus has a small standby current and a short wake-up time when operating in the low standby current mode.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

In the following, a plurality of embodiments are provided to illustrate the invention. However, the invention is not limited to the illustrated embodiments, and a suitable combination among the embodiments is allowed. The term "couple" used throughout this specification (including the claims) may refer to any direct or indirect connection means. For example, if it is described that the first device is coupled to the second device, it should be understood that the first device may be directly connected to the second device or indirectly connected to the second device through other devices or certain connection means. Moreover, the term "signal" may refer to at least one electric current, electric voltage, electric charge, temperature, data, electromagnetic wave, or any other one or more signals.

Figure 1:
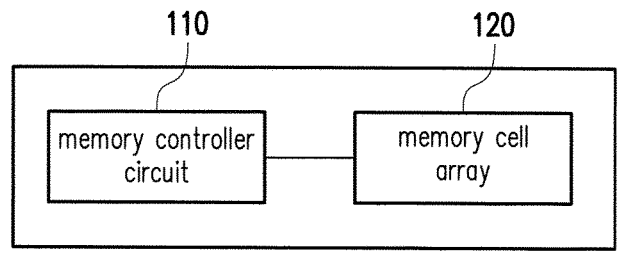
FIG. 1 shows a schematic diagram of a flash memory storage apparatus according to an embodiment of the invention.

FIG. 1 shows a schematic diagram of a flash memory storage apparatus according to an embodiment of the invention. With reference to FIG. 1, in this embodiment, a flash memory storage apparatus 100 includes a memory controller circuit 110 and a memory cell array 120. The memory cell array 120 is coupled to the memory controller circuit 110. The memory controller circuit 110 is configured to control the flash memory storage apparatus 100 to operate in one of a plurality of operation modes. The memory cell array 120 is configured to store data. In this embodiment, the operation modes of the flash memory storage apparatus 100 include a low standby current mode, a normal standby mode, and a deep power down mode.

In this embodiment, the memory controller circuit 110 controls the flash memory storage apparatus 100 to operate in the deep power down mode so as to further reduce a standby current in the memory controller circuit 110 when operating in the normal standby mode. In the deep power down mode, methods to reduce the standby current include, for example, turning off various operations of the flash memory storage apparatus 100 in the normal standby mode, or blocking the power supply required for the operation of each component in the flash memory storage apparatus 100 through a power blocking scheme. In this embodiment, the memory controller circuit 110, for example, controls the flash memory storage apparatus 100 to enter the deep power down mode according to a deep power down command, and controls the flash memory storage apparatus 100 to leave the deep power down mode to enter the normal standby mode according to a wake-up command.

Therefore, in this embodiment, the current in the flash memory storage apparatus 100 when operating in the normal standby mode (a second current) is greater than the current in the flash memory storage apparatus 100 when operating in the deep power down mode (a third current). In this embodiment, the time to wake up the flash memory storage apparatus 100 from the normal standby mode (a second wake-up time) is shorter than the time to wake up the flash memory storage apparatus 100 from the deep power down mode (a third wake-up time). In this embodiment, the operation modes of the flash memory storage apparatus 100 further include the low standby current mode. The standby current in the low standby current mode (a first current) is smaller than the second current and greater than the third current. The wake-up time in the low standby current mode (a first wake-up time) is longer than the second wake-up time and shorter than the third wake-up time. In the following, a plurality of embodiments are provided to illustrate the low standby current mode of the invention.

In this embodiment, the circuit structures of the memory controller circuit 110 and the memory cell array 120 may be respectively implemented by using any suitable circuit in the related art, and are not limited by the invention. Regarding the detailed steps and embodiments thereof, enough teachings, suggestions and implementation illustration may be obtained with reference to common knowledge of the related art, so the details will not be repeated herein.

Figure 2:
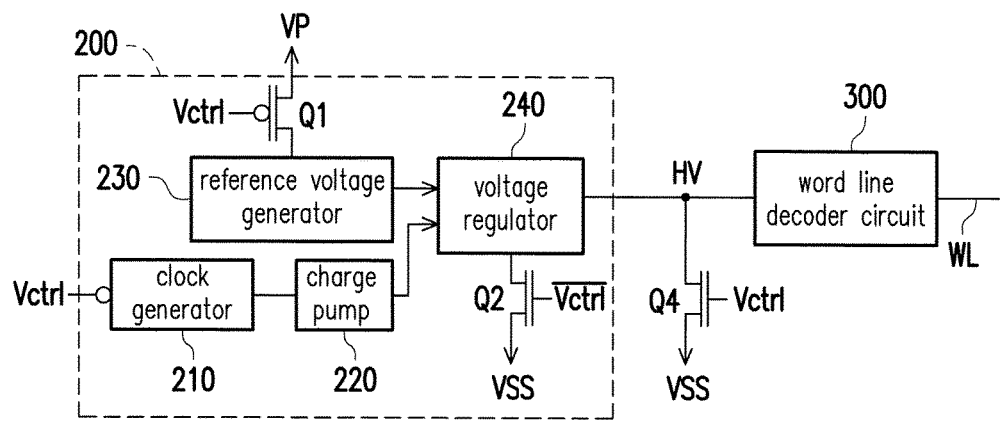
FIG. 2 shows a schematic diagram of a word line decoder circuit and a voltage generator circuit according to an embodiment of the invention.
Figure 3:
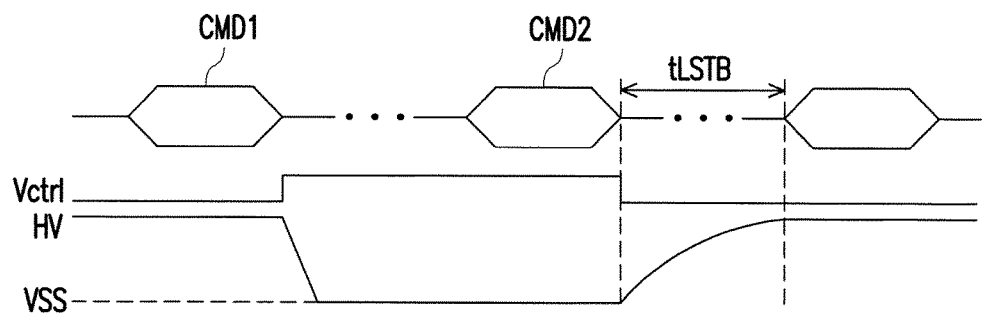
FIG. 3 shows a schematic diagram of each of the operation signals in the embodiment of FIG. 2.

FIG. 2 shows a schematic diagram of a word line decoder circuit and a voltage generator circuit according to an embodiment of the invention. FIG. 3 shows a schematic diagram of each of the operation signals in the embodiment of FIG. 2. With reference to FIG. 1 to FIG. 3, the flash memory storage apparatus 100 of FIG. 1 further includes a voltage generator circuit 200 and a word line decoder circuit 300. In this embodiment, the word line decoder circuit 300 is coupled to one or more word lines WL of the flash memory storage apparatus 100. The voltage generator circuit 200 is coupled to the word line decoder circuit 300. The voltage generator circuit 200 is configured to provide a high voltage to the word line decoder circuit 300 through a node HV to serve as the power supply required for operation. In FIG. 3, the signal designated as HV refers to the voltage signal located at the node HV.

Specifically, in this embodiment, the voltage generator circuit 200 includes a clock generator 210, a charge pump 220, a reference voltage generator 230, and a voltage regulator 240. The reference voltage generator 230 is coupled to a first voltage VP by a first transistor switch Q1, and the voltage regulator 240 is coupled to a second voltage VSS by a second transistor switch Q2. The clock generator 210 includes a third transistor switch (not shown). The node HV is coupled to the second voltage VSS by a fourth transistor switch Q4. In this embodiment, the clock generator 210 is configured to generate a clock signal for the charge pump 220. The charge pump 220 then generates a voltage signal according to the clock signal and outputs the voltage signal to the voltage regulator 240. The reference voltage generator 230 is configured to generate a reference voltage signal and output the reference voltage signal to the voltage regulator 240. The voltage regulator 240 generates the high voltage according to the reference voltage signal and the voltage signal, and outputs the high voltage to the word line decoder circuit 300.

In this embodiment, the memory controller circuit 110 controls the flash memory storage apparatus 100 to enter the low standby current mode according to a first command CMD1. The memory controller circuit 110 wakes up the flash memory storage apparatus 100 from the low standby current mode to enter the normal standby mode according to a second command CMD2. In this embodiment, when the flash memory storage apparatus 100 enters the low standby current mode, a control signal Vctrl is raised to a high level. When the flash memory storage apparatus 100 leaves the low standby current mode, the control signal Vctrl is lowered to a low level. In the low standby current mode, the control signal Vctrl at the high level does not turn on the first transistor switch Q1, the second transistor switch Q2, and the third transistor switch in the clock generator 210. Consequently, the power supply required for the operation of the voltage generator circuit 200, such as the first voltage VP and the second voltage VSS, is blocked from being supplied to each circuit component thereof such that the clock generator 210, the charge pump 220, the reference voltage generator 230 and the voltage regulator 240 cease operation. In addition, in the low standby current mode, the fourth transistor switch Q4 is turned on according to the control signal Vctrl so that the voltage of the node HV is pulled down to the second voltage VSS to further reduce power consumption of the word line decoder circuit 300. Therefore, in this embodiment, the current in the flash memory storage apparatus 100 when operating in the low standby current mode (the first current) is smaller than the current in the flash memory storage apparatus 100 when operating in the normal standby mode (the second current). In FIG. 2, the signal designated as $\overline{Vctrl}$ refers to an inverted signal of the control signal Vctrl.

In this embodiment, the data that the memory cell array 120 stores includes read-only memory data, such as programmable read-only memory data (PROM data). When the flash memory storage apparatus 100 operates in the low standby current mode, the read-only memory data is kept, such as being kept in a volatile memory. Consequently, when the flash memory storage apparatus 100 is woken up from the low standby current mode to enter the normal standby mode or normal operation mode, the read-only memory data does not need to be reloaded into the volatile memory so that the wake-up time tLSTB thereof is short. In this embodiment, when the flash memory storage apparatus 100 is in the deep power down mode, the read-only memory data is not kept. Consequently, when the flash memory storage apparatus 100 is woken up, the read-only memory data thereof needs to be reloaded into the volatile memory so that the wake-up time thereof is long. Therefore, in this embodiment, the time to wake up the flash memory storage apparatus 100 from the low standby current mode (the first wake-up time) is shorter than the time to wake up the flash memory storage apparatus 100 from the deep power down mode (the third wake-up time).

In this embodiment, the circuit structures of the voltage generator circuit 200 and the word line decoder circuit 300 may be respectively implemented by using any suitable circuit in the related art, and are not limited by the invention. Regarding the detailed steps and embodiments thereof, enough teachings, suggestions and implementation illustration may be obtained with reference to common knowledge of the related art, so the details will not be repeated herein.

Figure 4:
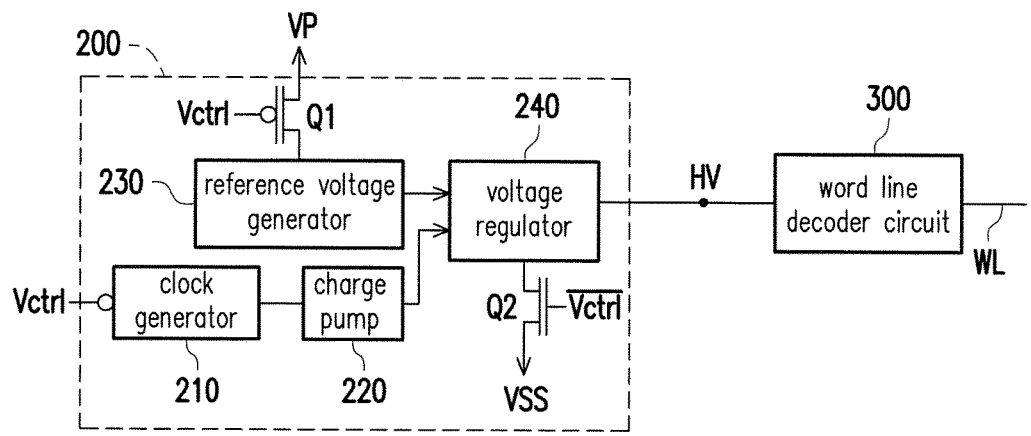
FIG. 4 shows a schematic diagram of a word line decoder circuit and a voltage generator circuit according to another embodiment of the invention.
Figure 5:
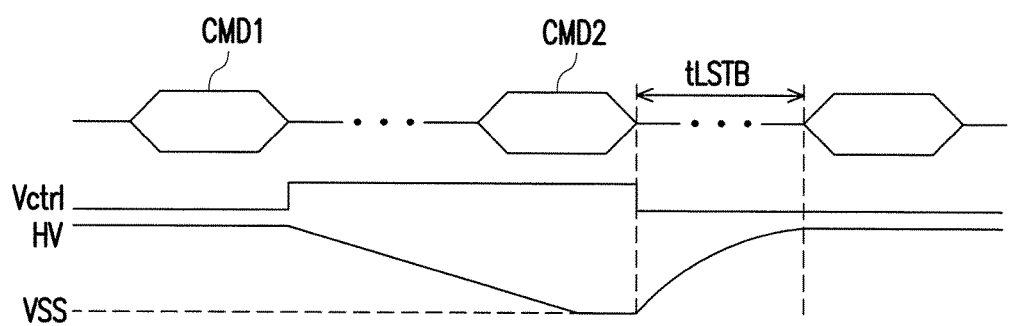
FIG. 5 shows a schematic diagram of each of the operation signals in the embodiment of FIG. 4.

FIG. 4 shows a schematic diagram of a word line decoder circuit and a voltage generator circuit according to another embodiment of the invention. FIG. 5 shows a schematic diagram of each of the operation signals in the embodiment of FIG. 4. With reference to FIG. 2 to FIG. 5, the word line decoder circuit and the voltage generator circuit of this embodiment are similar to those in the embodiment of FIG. 2. However, the main difference between them lies in that a node HV is not coupled to a second voltage VSS by a transistor switch, for example. In this embodiment, in the low standby current mode, the voltage of the node HV is floating so as to be pulled down to the second voltage VSS at a slower rate. Besides, regarding the operation methods of the flash memory storage apparatus in this embodiment of the invention, enough teachings, suggestions and implementation illustration may be obtained from recitations related to the embodiment as shown in FIG. 1 to FIG. 3, so the details will not be repeated herein.

In summary of the above, in the exemplary embodiments of the invention, the operation modes of the flash memory storage apparatus include the low standby current mode. The standby current in the flash memory storage apparatus when operating in the low standby current mode is smaller than the standby current in the flash memory storage apparatus when operating in the normal standby mode. The flash memory storage apparatus, according to the command, enters the low standby current mode or leaves the low standby current mode to return to the normal standby mode. The time to wake up the flash memory storage apparatus from the low standby current mode is shorter than the time to wake up the flash memory storage apparatus from the deep power down mode.

Although the embodiments are already disclosed as above, these embodiments should not be construed as limitations on the scope of the invention. It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A flash memory storage apparatus having a plurality of operation modes, the flash memory storage apparatus comprising:
   a memory controller circuit configured to control the flash memory storage apparatus to operate in one of the plurality of operation modes, wherein the plurality of operation modes comprise a low standby current mode; and
   a memory cell array coupled to the memory controller circuit and configured to store data that comprises read-only memory data,
   wherein the memory controller circuit controls the flash memory storage apparatus to enter the low standby current mode according to a first command, and wakes up the flash memory storage apparatus from the low standby current mode according to a second command,
   wherein when the flash memory storage apparatus operates in the low standby current mode, the read-only memory data is kept,
   wherein the plurality of operation modes comprise a normal standby mode and a deep power down mode; and the flash memory storage apparatus needs a first wake-up time, a second wake-up time, and a third wake-up time to be woken up from the low standby current mode, the normal standby mode, and the deep power down mode respectively, wherein the first wake-up time is longer than the second wake-up time and shorter than the third wake-up time.

2. The flash memory storage apparatus as recited in claim 1, wherein the plurality of operation modes has a first current, a second current, and a third current when operating in the low standby current mode, the normal standby mode, and the deep power down mode respectively, wherein the first current is smaller than the second current and greater than the third current.

3. The flash memory storage apparatus as recited in claim 1, further comprising:
   a word line decoder circuit coupled to a plurality of word lines of the flash memory storage apparatus; and
   a voltage generator circuit coupled to the word line decoder circuit and configured to provide a high voltage to the word line decoder circuit through a node,
   wherein in the low standby current mode, a plurality of transistor switches in the voltage generator circuit are not turned on according to a control signal.

4. The flash memory storage apparatus as recited in claim 3, wherein the voltage generator circuit comprises a clock generator, a reference voltage generator, and a voltage regulator; and the reference voltage generator is coupled to a first voltage by a first transistor switch, the voltage regulator is coupled to a second voltage by a second transistor switch, and the clock generator comprises a third transistor switch, wherein in the low standby current mode, the first transistor switch, the second transistor switch and the third transistor switch are not turned on according to the control signal.

5. The flash memory storage apparatus as recited in claim 4, wherein the node is coupled to the second voltage by a fourth transistor switch; and in the low standby current mode, the fourth transistor switch is turned on according to the control signal so as to change a voltage of the node to the second voltage.

6. The flash memory storage apparatus as recited in claim 3, wherein in the low standby current mode, the node is floating.

7. A flash memory storage apparatus having a plurality of operation modes, the flash memory storage apparatus comprising:
   a memory controller circuit configured to control the flash memory storage apparatus to operate in one of the plurality of operation modes, wherein the plurality of operation modes comprises a low standby current mode; and
   a memory cell array coupled to the memory controller circuit and configured to store data that comprises read-only memory data,
   wherein the memory controller circuit controls the flash memory storage apparatus to enter the low standby current mode according to a first command, and wakes up the flash memory storage apparatus from the low standby current mode according to a second command,
   wherein the plurality of operation modes comprise a normal standby mode and a deep power down mode; and the flash memory storage apparatus needs a first wake-up time, a second wake-up time, and a third wake-up time to be woken up from the low standby current mode, the normal standby mode, and the deep power down mode respectively, wherein the first wake-up time is longer than the second wake-up time and shorter than the third wake-up time.

8. The flash memory storage apparatus as recited in claim 7, further comprising:
   a word line decoder circuit coupled to a plurality of word lines of the flash memory storage apparatus; and
   a voltage generator circuit coupled to the word line decoder circuit and configured to provide a high voltage to the word line decoder circuit through a node,
   wherein in the low standby current mode, a plurality of transistor switches in the voltage generator circuit are not turned on according to a control signal.

9. The flash memory storage apparatus as recited in claim 8, wherein the voltage generator circuit comprises a clock generator, a reference voltage generator, and a voltage regulator; and the reference voltage generator is coupled to a first voltage by a first transistor switch, the voltage regulator is coupled to a second voltage by a second transistor switch, and the clock generator comprises a third transistor switch, wherein in the low standby current mode, the first transistor switch, the second transistor switch and the third transistor switch are not turned on according to the control signal.

10. The flash memory storage apparatus as recited in claim 7, wherein the plurality of operation modes has a first current, a second current, and a third current when operating in the low standby current mode, the normal standby mode, and the deep power down mode respectively, wherein the first current is smaller than the second current and greater than the third current.

* * * * *